US012375084B2

(12) United States Patent
Hong et al.

(10) Patent No.: US 12,375,084 B2
(45) Date of Patent: Jul. 29, 2025

(54) SPIN-CHARGE CONVERSION BASED SPIN LOGIC DEVICE

(71) Applicants: INDUSTRY-ACADEMIC COOPERATION FOUND., YONSEI UNIV., Korea (KR); INU Research & Business Foundation, Incheon (KR); IND.-UNIV. COOP. FOUND., HANYANG UNIV. ERICA CAMP., Ansan-si (KR)

(72) Inventors: Jongill Hong, Seoul (KR); Taehui Na, Incheon (KR); Saeroonter Oh, Seoul (KR)

(73) Assignees: INDUSTRY-ACADEMIC COOPERATION FOUNDATION, YONSEI UNIVERSITY, Seoul (KR); INU Research & Business Foundation, Incheon (KR); INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 430 days.

(21) Appl. No.: 18/151,678

(22) Filed: Jan. 9, 2023

(65) Prior Publication Data

US 2024/0162905 A1 May 16, 2024

(30) Foreign Application Priority Data

Nov. 15, 2022 (KR) ........................ 10-2022-0152325

(51) Int. Cl.
*H03K 19/18* (2006.01)
*G11C 11/16* (2006.01)
(Continued)

(52) U.S. Cl.
CPC ............ *H03K 19/18* (2013.01); *G11C 11/161* (2013.01); *H10N 50/10* (2023.02); *H10N 50/80* (2023.02)

(58) Field of Classification Search
CPC ... G11C 11/161; G11C 11/1675; H03K 19/16; H03K 19/18; H10N 50/10; H10N 50/80
See application file for complete search history.

(56) References Cited

U.S. PATENT DOCUMENTS

2020/0365652 A1* 11/2020 Hong ..................... H10N 50/80

FOREIGN PATENT DOCUMENTS

KR 102250755 B1 5/2021
KR 102302781 B1 9/2021

* cited by examiner

*Primary Examiner* — Brigitte A Paterson
(74) *Attorney, Agent, or Firm* — Andrew D. Fortney; Central California IP Group, P.C.

(57) ABSTRACT

A spin logic device includes a first stage unit in which one side of the first magnetic layer is connected to an upper end of a first spin-charge conversion layer, a first dielectric layer is connected to a lower end of the other side of the first magnetic layer, a first conductive channel for receiving input current is connected to a lower end of the first dielectric layer, a first input portion formed of a conductor for receiving a first drive voltage is connected to an upper end of one side of the first magnetic layer, a second conductive channel for outputting first output current is connected to a lower end of the first spin-charge conversion layer, and a first conductor having a ground is connected to a lower end of the second conductive channel. A resistor for outputting steady current as the first output current may be connected between nodes on opposite ends of the second conductive channel.

7 Claims, 7 Drawing Sheets

(51) Int. Cl.
*H10N 50/10* (2023.01)
*H10N 50/80* (2023.01)

US 12,375,084 B2

SPIN-CHARGE CONVERSION BASED SPIN LOGIC DEVICE

CROSS-REFERENCE TO RELATED APPLICATIONS

This U.S. non-provisional patent application claims priority under 35 U.S.C. § 119 to Korean Patent Application No. 10-2022-0152325, filed on Nov. 15, 2022, in the Korean Intellectual Property Office, the entire contents of which are hereby incorporated by reference.

TECHNICAL FIELD

The present disclosure relates to a spin-charge conversion-based spin logic device.

BACKGROUND

Spintronics refers to electronics utilizing the spin of electrons.

In this regard, spintronics devices have attracted increasing attention as other next-generation semiconductor devices do in recent years.

Spintronics devices have attracted considerable attention since they have advantages of non-volatile data, fast switching speed and large storage capacity over other devices in the related art.

Since there is a method of generating spin-polarized current by allowing current to flow to a ferromagnetic material, the introduction of a spin logic device using such a ferromagnetic material may be considered as a method of generating spin-polarized current.

In this regard, a spin logic device capable of controlling a magnetization direction of a ferromagnetic material may be introduced in consideration of the magnetization direction of the ferromagnetic material and characteristics of a voltage (or current) generated according to spin-charge conversion. Thus, a method of utilizing such a spin logic device in a next-generation semiconductor technology, or the like, may be considered.

SUMMARY

An aspect of the present disclosure is to provide a spin logic device, capable of switching a magnetization direction of a ferromagnetic material in consideration of voltage (or current) characteristics exhibited according to the magnetization direction of the ferromagnetic material and spin-charge conversion.

A spin logic device according to an example embodiment includes a first stage unit in which one side of the first magnetic layer is connected to an upper end of a first spin-charge conversion layer, a first dielectric layer is connected to a lower end of the other side of the first magnetic layer, a first conductive channel for receiving input current is connected to a lower end of the first dielectric layer, a first input portion formed of a conductor for receiving a first drive voltage is connected to an upper end of one side of the first magnetic layer, a second conductive channel for outputting first output current is connected to a lower end of the first spin-charge conversion layer, and a first conductor having a ground is connected to a lower end of the second conductive channel. A resistor for outputting steady current as the first output current may be connected between nodes on opposite ends of the second conductive channel.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
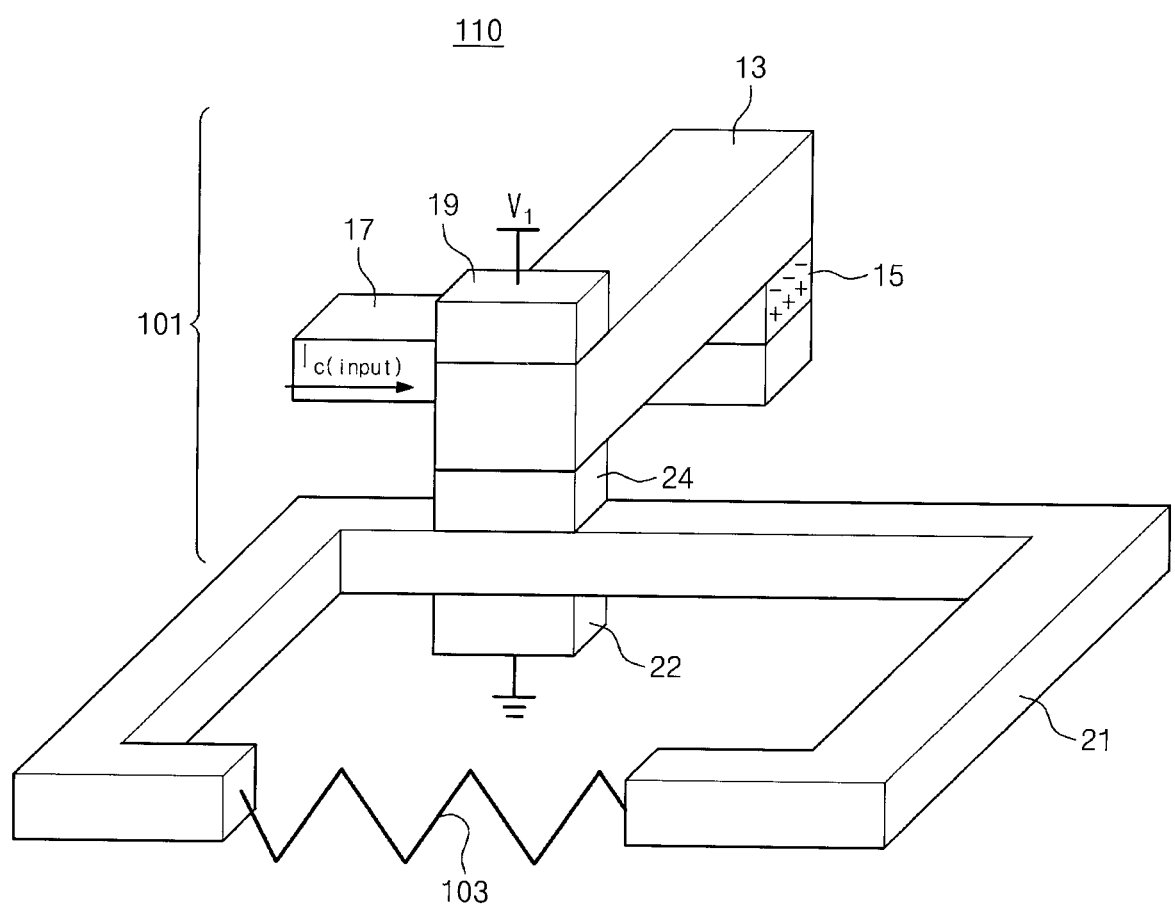
FIG. 1 is a view illustrating a spin logic device according to an example embodiment of the present disclosure.

Hereinafter, embodiments of the present disclosure will be described in detail with reference to the accompanying drawings. The description does not limit the present disclosure to specific embodiments, and it should be understood that the present disclosure covers all the modifications, equivalents and replacements included within the idea and technical scope of the present disclosure. In describing each drawing, like reference numerals refer to like elements and if not contrarily defined, all terms used herein including technological or scientific terms have the same meanings as those generally understood by a person with ordinary skill in the art.

In this document, unless explicitly described to the contrary, the word "comprise" and variations such as "comprises" or "comprising" will be understood to imply the inclusion of stated elements but not the exclusion of any other elements. Further, in various embodiments of the present disclosure, each of components, functional blocks or means may be constituted by one or more lower components and electrical, electronic, and mechanical functions performed by respective components may be implemented as various known devices or mechanical elements including an electronic circuit, an integrated circuit, an application specific integrated circuit (ASIC), etc., and the respective components may be separately implemented or two or more components may be integrated into one and implemented.

FIG. 1 is a view illustrating a spin logic device according to an example embodiment of the present disclosure.

Referring to FIG. 1, a spin logic device 110 according to the present disclosure may include a first stage unit 101.

In a first stage unit 101, one side of a first magnetic layer 13 may be connected to an upper end of a first spin-charge conversion layer 24, a first dielectric layer 15 may be connected to a lower end of the other side of the first magnetic layer 13, a first conductive channel 17 for receiving input current $I_{c(input)}$ may be connected to a lower end of the first dielectric layer 15, a first input portion 19 formed of a conductor for receiving a first drive voltage $V_1$ may be connected to an upper end of one side of the first magnetic layer 13, a second conductive channel 21 for outputting a first output current $I_{1(output)}$ may be connected to a lower end of the first spin-charge conversion layer 24, and a first conductor 22 having a ground may be connected to a lower end of the second conductive channel 21.

The first magnetic layer 13 may be a layer formed of a ferromagnetic material, and may be formed of a ferromagnetic material such as iron, nickel, cobalt, iron oxide, chromium oxide, or alloys thereof. The first dielectric layer 15 may be formed of a material such as a dielectric material, a ferroelectric material, an antiferroelectric material, or a multiferroics material.

The first spin-charge conversion layer 24 may be formed of a material having a spin-charge conversion effect.

The first input portion 19 and the first conductor 22 may be formed of a conductive material having predetermined resistance.

In this case, a resistor 103 for outputting steady current as the first output current $I_{1\,(output)}$ may be connected between opposite ends of the second conductive channel 21.

In this case, an operation of the first stage unit 101 in the spin logic device 110 according to the present disclosure will be described, as follows.

When the input current $I_{c(input)}$ is applied through the first conductive channel 17, magnetic anisotropy energy of the first magnetic material layer 13 may be reduced due to an effect such as a voltage or electric polarization in the first dielectric layer 15 to change a direction of magnetization in the first magnetic layer 13. In this case, when the first drive voltage $V_1$ is applied through the first input portion 19, spin current generated depending on magnetization of the first magnetic layer 13 may be applied to the first spin-charge conversion layer 24 and spin-charge conversion may occur through the first spin-charge conversion layer 24, and thus the first output current $I_{1(output)}$ may be induced in the second conductive channel 21.

When the input current $I_{c(input)}$ is applied through the first conductive channel 17, the direction of the magnetization in the first magnetic layer 13 may be changed due to an effect such as a magnetoelectric effect in the first dielectric layer 15. In this case, when the first drive voltage $V_1$ is applied through the first input portion 19, the spin current generated depending on the magnetization of the first magnetic layer 13 may be applied to the first spin-charge conversion layer 24 and spin-charge conversion may occur through the first spin-charge conversion layer 24, and thus the first output current $I_{1(output)}$ may be induced in the second conductive channel 21.

Figure 2:
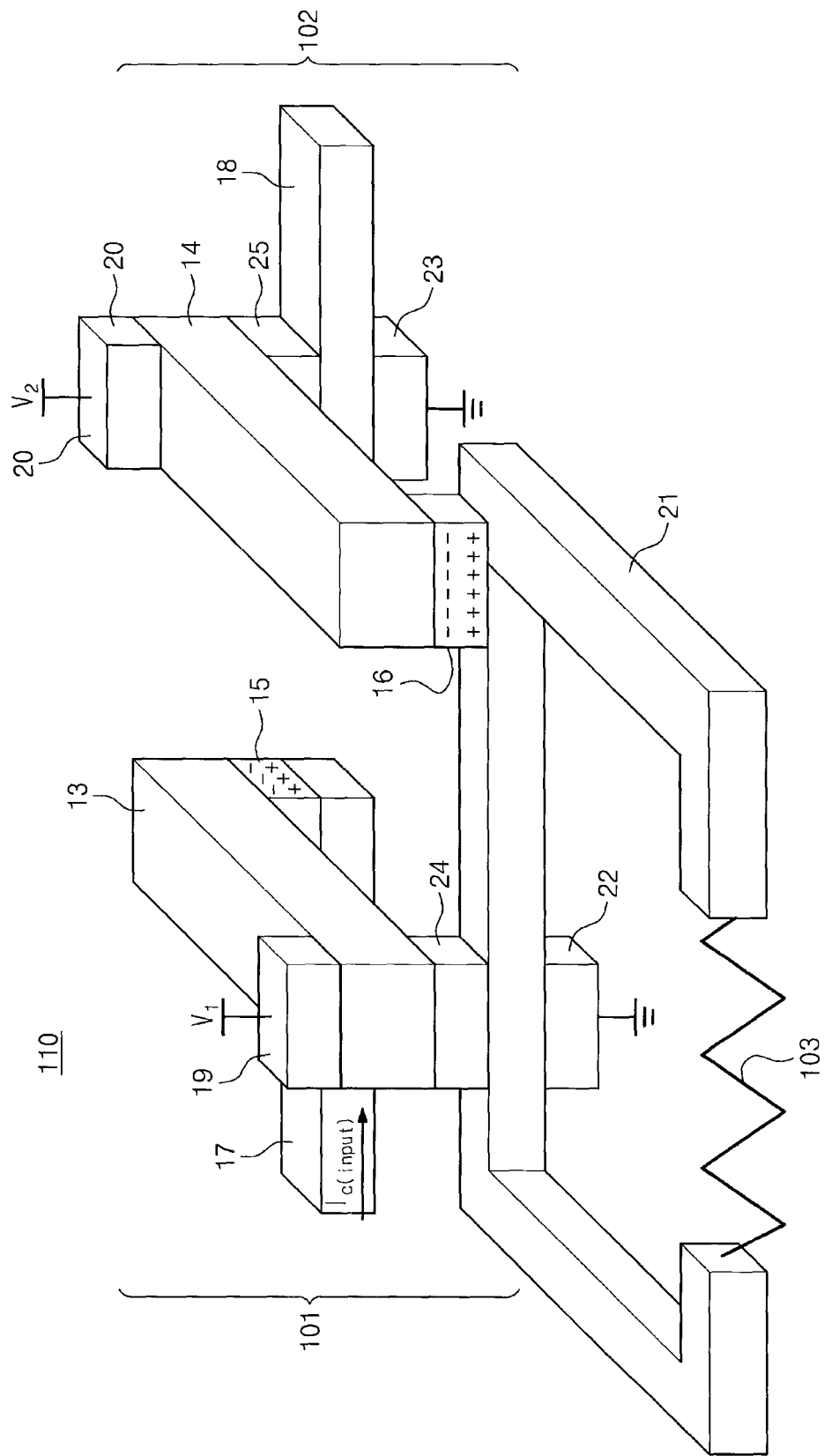
FIGS. 2 to 5 are views illustrating an operation of a spin logic device according to an example embodiment of the present disclosure.

In this case, according to an example embodiment, the spin logic device 110 may further include a second stage unit 102, as illustrated in FIG. 2.

In the second stage unit 102, one side of a second magnetic layer 14 may be connected to an upper end of a second spin-charge conversion layer 25, a second dielectric layer 16 may be connected to a lower end of the other side of a second magnetic layer 14, a second conductive channel 21 may be connected to a lower end of the second dielectric layer 16, a second input portion 20 formed of a conductor for receiving a second drive voltage $V_2$ may be connected to an upper end of one side of the second magnetic layer 14, a third conductive channel 18 for outputting second output current $I_{2(output)}$ may be connected to a lower end of the second spin-charge conversion layer 25, and a second conductor 23 having a ground may be connected to a lower end of a third conductive channel 18.

The second magnetic layer 14 may be a layer formed of a ferromagnetic material, and may be formed of a ferromagnetic material such as iron, nickel, cobalt, iron oxide, chromium oxide, or alloys thereof. The second dielectric layer 16 may be formed of a material such as a dielectric material, a ferroelectric material, an antiferroelectric material, or a multiferroics material.

The second spin-charge conversion layer 25 may be formed of a material having a spin-charge conversion effect.

The second input portion 20 and the second conductor 23 may be formed of a conductive material having predetermined resistance.

Hereinafter, an operation of the spin logic device 110 including the first stage unit 101 and the second stage unit 102 will be described in detail.

Figure 3:
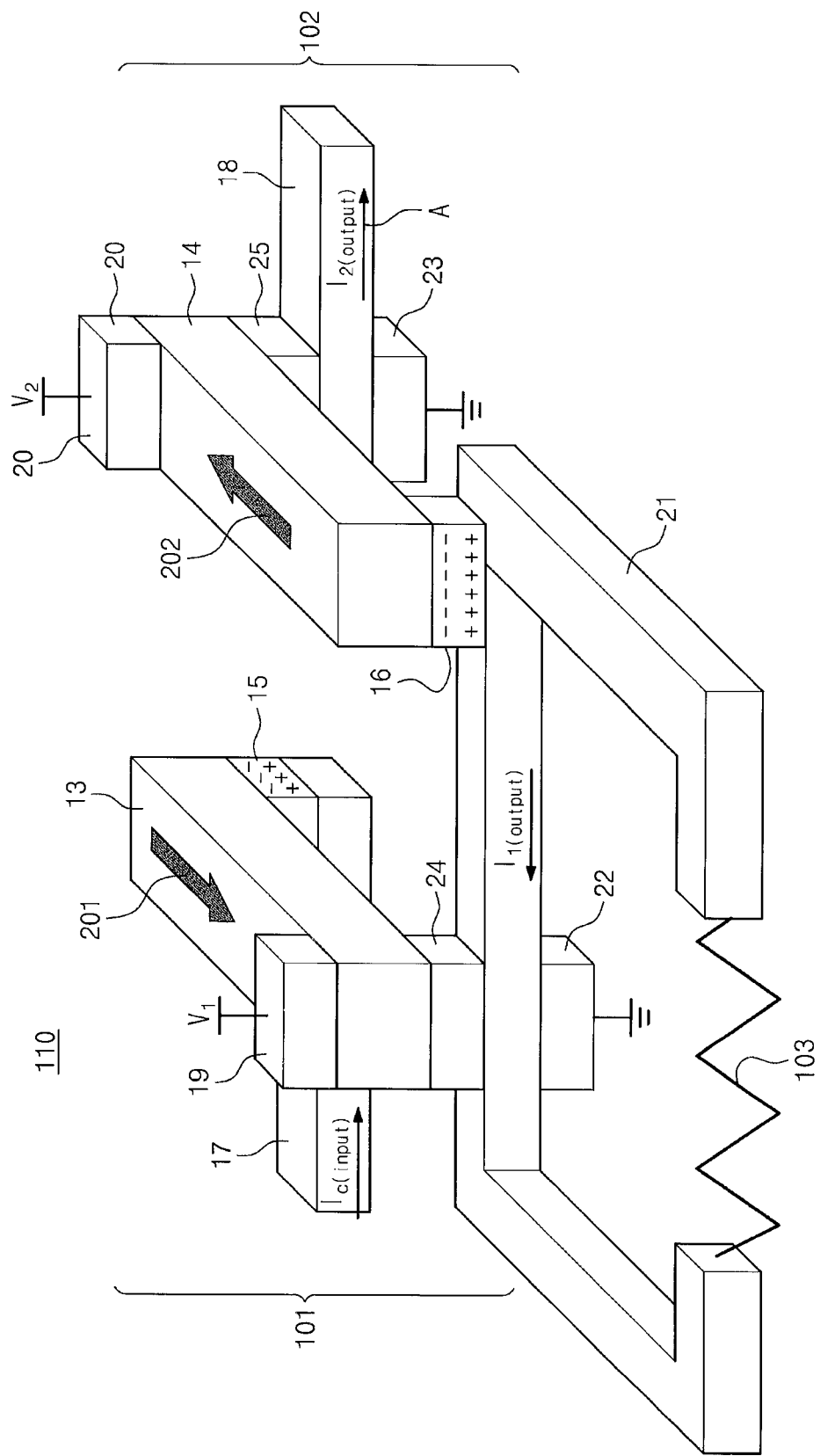

As illustrated in FIG. 3, when positive (+) current is applied as the input current $I_{c(input)}$ through the first conductive channel 17 while the first drive voltage $V_1$ is be applied through the first input portion 19 and the second drive voltage $V_2$ is applied through the second input portion 20, the magnetization of the first magnetic layer 13 may be switched from the other to one direction of magnetization with the help of the first dielectric layer 15, as indicated by an arrow denoted as a reference numeral 201. The help of the first dielectric layer 15 may be a voltage or electrical polarization phenomenon, a magnetoelectric effect, or the like.

When the magnetization is switched in the first magnetic layer 13 in such a manner, spin current may be generated depending on the magnetization of the first magnetic layer 13, and a potential difference may occur as spin-charge conversion occurs through the first spin-charge conversion layer 24. Accordingly, the first output current $I_{1(output)}$ induced in the first stage unit 101 may flow through the second conductive channel 21 in the second stage unit 102.

As described above, when the first output current $I_{1(output)}$ is induced in the second conductive channel 21, the magnetization of the second magnetic layer 14 may be switched from the other to one direction of magnetization with the help of the second dielectric layer 16 by the first output current $I_{1(output)}$, as indicated by an arrow denoted as a reference numeral 202. The help of the second dielectric layer 16 may be a voltage or electrical polarization phenomenon, a magnetoelectric effect, or the like.

Then, the spin current generated depending on the magnetization of the second magnetic layer 14 is applied to the second spin-charge conversion layer 25 and a spin-charge conversion occurs through the second spin-charge conversion layer 25, and thus a potential difference may occur. Accordingly, the second output current $I_{2(output)}$ may be output to the third conductive channel 18 in a first direction A.

Figure 4:
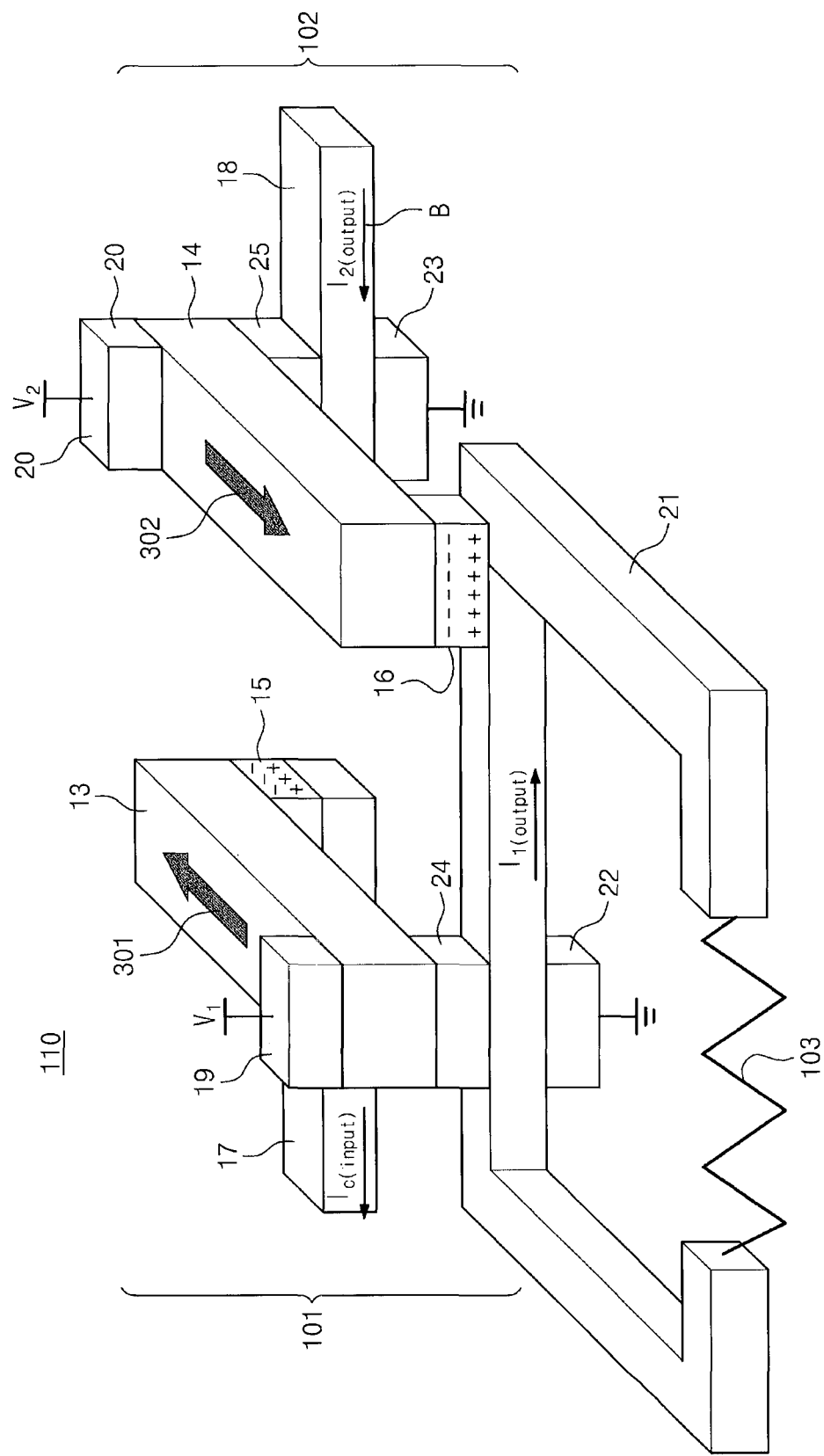

As illustrated in FIG. 4, when negative (−) current is applied as the input current $I_{c(input)}$ through the first conductive channel 17 while a first drive voltage $V_1$ is applied through the first input portion 19 and a second drive voltage $V_2$ is applied through the second input portion 20, the magnetization of the first magnetic layer 13 may be switched from one to the other direction with the help of the first dielectric layer 15, as indicated by an arrow denoted as a reference numeral 301. The help of the first dielectric layer 15 may be a voltage or electrical polarization phenomenon, a magnetoelectric effect, or the like.

When the magnetization is switched in the first magnetic layer 13 in such a manner, spin current may be generated depending on the magnetization of the first magnetic layer 13, and a potential difference may occur as spin-charge conversion occurs through the first spin-charge conversion layer 24. Accordingly, the first output current $I_{1(output)}$ may be induced in the second conductive channel 21 in the direction from the first stage unit 101 to the second stage unit 102.

As described above, when the first output current $I_{1(output)}$ is induced in the second conductive channel 21, the magnetization of the first magnetic layer 14 may be switched from one to the other direction with the help of the second dielectric layer 16 given by the first output current $I_{1(output)}$, as indicated by an arrow denoted as a reference numeral 302. The help of the first dielectric layer 16 may be a voltage or electrical polarization phenomenon, a magnetoelectric effect, or the like.

Then, spin current generated depending on the magnetization of the second magnetic layer 14 may be applied to the second spin-charge conversion layer 25, and spin-charge conversion may occur through the second spin-charge conversion layer 25, so that a potential difference may occur. Accordingly, the second output current $I_{2(output)}$ may be induced in the third conductive channel 18 to be output in a second direction B.

As described above, the spin logic device 110 according to the present disclosure has a feature in which the magnetization directions of the first magnetic layer 13 and the second magnetic layer 14 are switched depending on the direction of the input current $I_{c(input)}$ applied through the first conductive channel 17. Therefore, a user may appropriately adjust a direction of the input current $I_{c(input)}$, applied to the spin logic device 110, to be positive (+) or negative (−), so that the magnetization direction of the first magnetic layer 13 and the second magnetic layer 14 are switched. Through such a manner, the spin logic device 110 according to the present disclosure may be utilized in various fields such logic devices and memory devices.

In this case, the spin logic device 110 according to the present disclosure has a feature in which a resistor 103 is connected between nodes on opposite ends of the second conductive channel 21. When the resistor 103 is not present in the second conductive channel 21, the first output current $I_{1(output)}$ may have a feature of flowing as spike current only for a significantly small amount of time, as illustrated by reference numeral 510 of FIG. 5.

The first output current $I_{1(output)}$ may be used for the magnetization switching of the second magnetic layer 14. However, when the first output current $I_{1(output)}$ is induced as spike current, it may be difficult to surely secure the magnetization switching of the second magnetic layer 14.

Figure 5:
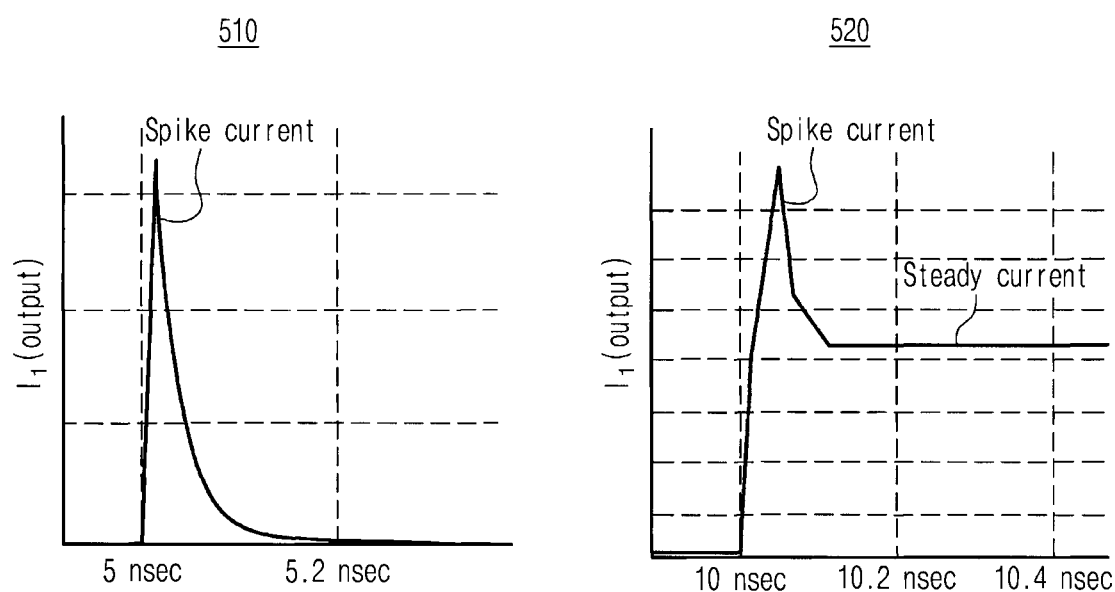

In this regard, the spin logic device 110 according to the present disclosure may include the resistor 103 in the second conductive channel 21 to output steady current as the first output current $I_{1(output)}$, as illustrated by a reference numeral 520 of FIG. 5. As described above, when the first output current $I_{1(output)}$ is steady current having the predetermined magnitude as illustrated by a reference numeral 520 of FIG. 5, the magnetization switching of the second magnetic layer 14 may be surely secured.

According to the above-described method, the spin logic device 110 according to the present disclosure may have a feature in which the magnetization direction of the first magnetic layer 13 and the second magnetic layer 14 is switched by applying first drive voltage $V_1$ through the first input portion 19, applying the second drive voltage $V_2$ through the second input portion 20, and applying the input current $I_{c(input)}$ through the first conductive channel 17.

Hereinafter, a description will be provided for a process of reading a magnetization direction designated in the first magnetic layer 13 and the second magnetic layer 14 after the switching of a magnetization direction of the first magnetic layer 13 and the second magnetic layer 14, included in the spin logic device 110 according to the present disclosure, is completed.

As illustrated in FIG. 3, it will be assumed that the magnetization of the first magnetic layer 13 and the second magnetic layer 14 is switched from the other to one direction by applying the first drive voltage $V_1$ through the first input portion 19, applying the second drive voltage $V_2$ through the second input portion 20, and applying positive (+) current through the first conductive channel 17, as indicated by reference numerals 201 and 202.

In this case, the spin logic device 110 according to the present disclosure may have a feature in which the second output current $I_{2(output)}$ of the first direction A is induced and output to the third conductive channel 18 when the first drive voltage $V_1$ is applied again through the first input portion 19 and the second drive voltage $V_2$ is applied again through the second input portion 20.

Meanwhile, as illustrated in FIG. 4, it will be assumed that the magnetization of the first magnetic layer 13 and the second magnetic layer 14 is switched from one to the other direction by applying the first drive voltage $V_1$ through the first input portion 19, applying the second drive voltage $V_2$ through the second input portion 20, and applying negative (−) current through the first conductive channel 17, as indicated by reference numerals 301 and 302.

In this case, the spin logic device 110 according to the present disclosure may have a feature in which the second output current $I_{2(output)}$ of the second direction B is induced in the third conductive channel 18 to be output when the first drive voltage $V_1$ is applied again through the first input portion 19 and the second drive voltage $V_2$ is applied again through the second input portion 20.

Accordingly, when the user intends to read the magnetization direction of the first magnetic material layer 13 and the second magnetic material layer 14 designated in the spin logic device 110 according to the present disclosure, the magnetization direction of the first magnetic layer 13 and the second magnetic layer 14 may be read by confirming a direction of the second output current $I_{2(output)}$, output from the third conductive channel 18, after the first drive voltage $V_1$ is applied again through the input portion 19 and the second drive voltage $V_2$ is applied again through the second input portion 20.

Under the assumption that the spin logic device 110 includes only the first stage unit 101 as illustrated in FIG. 1, when the user intends to read the magnetization direction of the first magnetic layer 13, the user may confirm the direction of the first output current $I_{1(output)}$, output from the second conductive channel 21, to read the magnetization direction of the first magnetic layer 13.

The first drive voltage $V_1$ and the second drive voltage $V_2$ may have the same polarity.

According to a modified embodiment, the first drive voltage $V_1$ and the second drive voltage $V_2$ may have opposite polarities.

Figure 6:
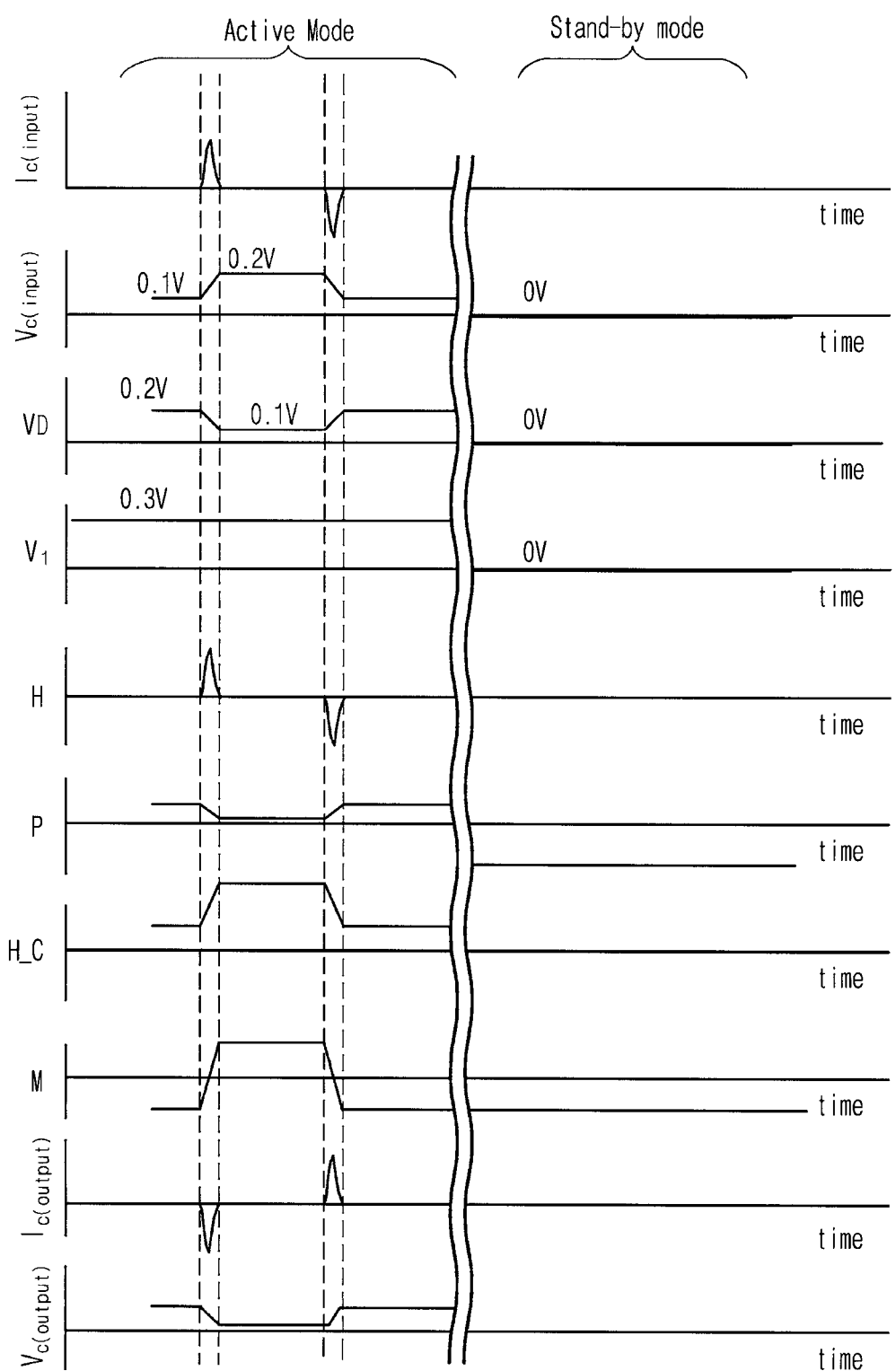
FIG. 6 is a timing diagram illustrating operating characteristics when a value of resistor is infinite in a spin logic device of FIG. 3.

FIG. 6 is a timing diagram illustrating operating characteristics when the resistor 103 is absent in a spin logic device of FIG. 3.

Figure 7:
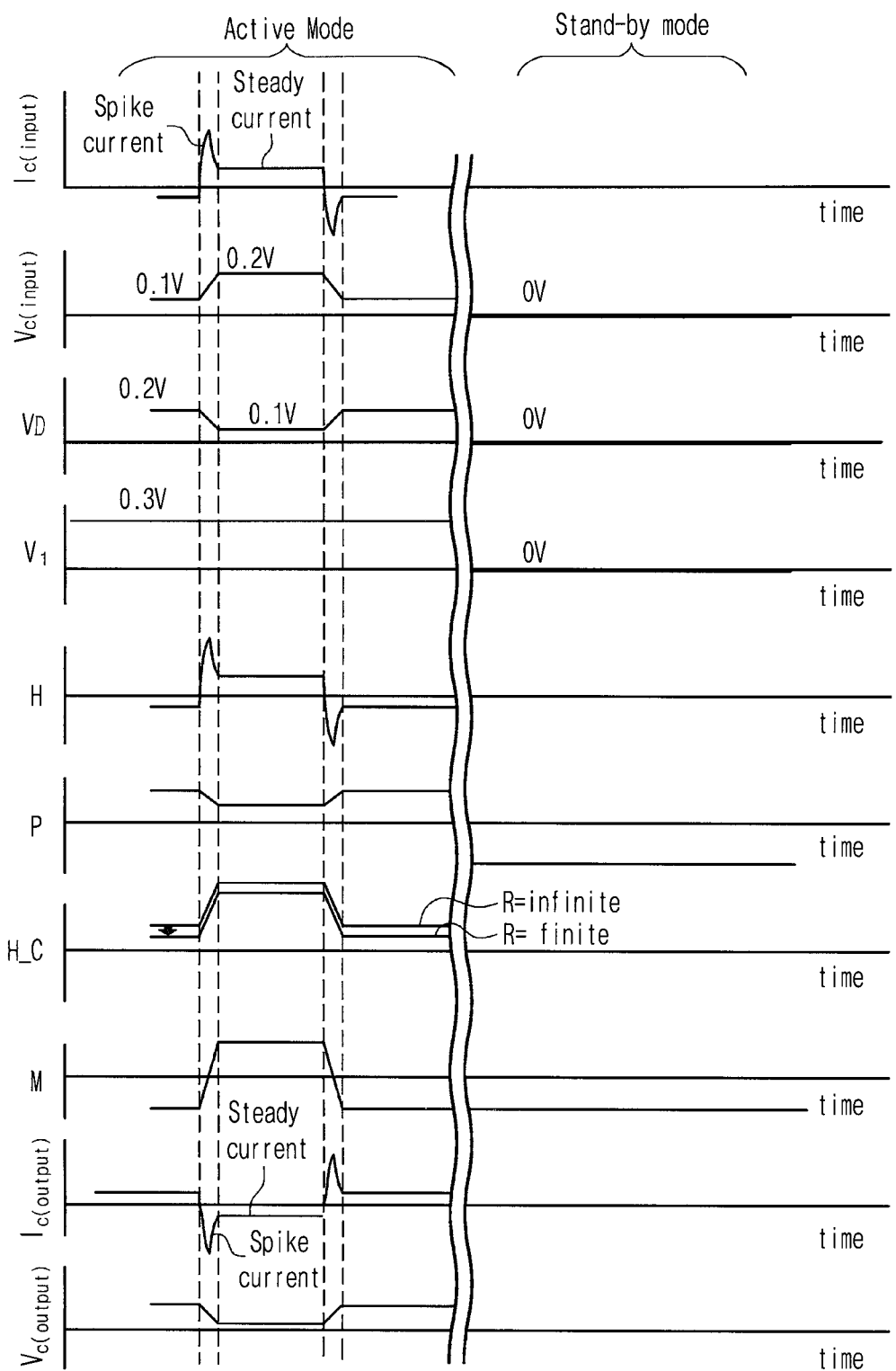
FIG. 7 is a timing diagram illustrating operation characteristics when a resistor has a predetermined value in the spin logic device of FIG. 3.

FIG. 7 is a timing diagram illustrating operation characteristics when a resistor 103 is inserted with a predetermined value in the spin logic device of FIG. 3.

Referring to FIGS. 3 and 6, it will be assumed that the input current $I_{c(input)}$ flowing through the first conductive channel 17 is in the form of spike when a value of a resistor 103 is infinite (or there is no resistor).

An input voltage $V_{c(input)}$ induced in the first conductive channel 17 may have a predetermined value given by CMOS logic device, spin logic device, or an appropriate circuit. For example, the input voltage $V_{c(input)}$ may be 0.1 V before the spike current, and the input voltage $V_{c(input)}$ may be 0.2 V after the spike current.

A dielectric voltage VD is a potential difference between opposite ends of the first dielectric layer 15. The first drive voltage $V_1$ may have a predetermined value (for example, 0.3 V) in an active mode and may be grounded in a standby mode. In the active mode, the first magnetic layer 13 may perform a switching operation. In the standby mode, the first magnetic layer 13 may be maintained in a predetermined magnetization direction.

The dielectric voltage VD may be a value obtained by subtracting the input voltage $V_{c(input)}$ from the first drive voltage $V_1$. In the active mode, the dielectric voltage VD may cause polarization P in the first dielectric layer 15. In the standby mode, the dielectric voltage VD may be zero, so that the polarization P of the first dielectric layer 15 may be changed.

The input current $I_{c(input)}$ flowing through the first conductive channel 17 may generate a magnetic field H around the first conductive channel 17, based on Ampere's law. A direction of the magnetic field H may determine the direction of the magnetization of the first magnetic layer 13. Due to the current in the form of a spike of the input current $I_{c(input)}$, the magnetic field H may be generated for only a time corresponding to a pulse time width of the input current $I_{c(input)}$.

The dielectric voltage VD may determine the polarization P of the first dielectric layer 15. When the gate voltage is high, the intensity of polarization may be high.

On the other hand, the intensity of a critical magnetic field H_C for the magnetization reversal of the first magnetic layer 13 may be in inverse proportion to the polarization P of the first dielectric layer 15. As an example, when the polarization P of the first dielectric layer 15 is large, the intensity of the critical magnetic field H_C for magnetization reversal may be low.

The magnetization direction of the first magnetic layer 13 may be determined by both intensity and duration of the magnetic field H generated around the first conductive channel 17 by the input current $I_{c(input)}$. The intensity of the magnetic field H is higher than intensity of the critical magnetic field H_C and the duration should be long enough to ensure the switching. When the duration of the magnetic field H is significantly short due to the spike current, the duration of the magnetic field H may not be long enough to surely reverse the magnetization direction of the first magnetic layer 13.

When the first drive voltage $V_1$ is applied through the first input portion 19, the spin current generated according to the magnetization of the first magnetic layer 13 may be applied to the first spin-charge conversion layer 24. As spin-charge conversion occurs through the first spin-charge conversion layer 24, the first output current $I_{1(output)}$ may be induced in the second conductive channel 21. The first output current $I_{1(output)}$ may be spike-shaped current. A direction of the input current $I_{c(input)}$ may be opposite to a direction of the first output current $I_{c(output)}$. The first output voltage $V_{c(output)}$ of the second conductive channel 21 may have a predetermined value by the first drive voltage $V_1$ through the first input portion 19. The output voltage $V_{c(input)}$ may depend on the direction of magnetization of the first magnetic layer 13. The first output current $I_{1(output)}$ may be used as an input current for switching the magnetization direction of the second magnetic layer 14. Accordingly, the input current $I_{c(input)}$ and/or the first output current $I_{1(output)}$ may be required to be changed to generate the magnetic field H for a sufficient duration.

Referring to FIGS. 3 and 7, the second conductive channel 21 and the resistor 103 are connected to form a closed loop. When the resistor 103 has a predetermined value, the resistor 103 may provide steady current having predetermined intensity in the active mode. The resistor 103 may be a conductive material, different from that of the second conductive channel 21.

It will be assumed that the input current $I_{c(input)}$ flowing through the first conductive channel 17 may be a sum of the spike current and the steady current. The steady current may be current having a predetermined magnitude. An input voltage $V_{c(input)}$ induced in the first conductive channel 17 may have a predetermined value given by CMOS logic device, spin logic device, or an appropriate circuit. It will be assumed that the input current $I_{c(input)}$ flowing through the first conductive channel 17 may be a sum of the spike current and the steady current. The steady current may be a current having a predetermined magnitude.

The dielectric voltage VD is a potential difference between opposite ends of the first dielectric layer 15. The first drive voltage $V_1$ may have a predetermined value in the active mode, and may be grounded in the standby mode.

The dielectric voltage VD may be a value obtained by subtracting the input voltage $V_{c(input)}$ from the first drive voltage $V_1$.

The input current $I_{c(input)}$ flowing through the first conductive channel 17 may generate a magnetic field H around the first conductive channel 17, based on Ampere's Law. The magnetic field H may determine the direction of magnetization of the first magnetic layer 13. The magnetic field H may be determined by spike current and steady current of the input current $i_{c(input)}$. The steady current may generate an additional magnetic field H. A time width of the spike current may be as small as 0.1 nanosecond (ns). Accordingly, the magnetic field H generated by the spike current having a short time width may not supply sufficient energy for magnetization reversal of the first magnetic layer 13.

However, when the resistor 103 is absent, the time width of the spike current is about 0.1 ns but the steady current may continuously generate an additional magnetic field H. Accordingly, both the magnetic field H generated by the steady current and the magnetic field H generated by the spike current may supply sufficient energy for magnetization reversal of the first magnetic layer 13.

Alternatively, the magnetic field H generated by the steady current may provide a value, greater than or equal to the intensity of the critical magnetic field H_C for magnetization reversal. As an example, a resistance value of the resistor 103 may be set such that the magnetic field H generated by the steady current has a value greater than or equal to the intensity of the critical magnetic field H_C for magnetization reversal. In addition, the magnetic field H generated by the steady current may stably maintain a switching state even after switching. Accordingly, the first magnetic layer 13 may definitely reverse or switch the magnetization and may improve the stability of written information.

The dielectric voltage VD may determine polarization P of the first dielectric layer 15. When the dielectric voltage VD is high, the intensity of the polarization P may be high.

The intensity of the critical magnetic field H_C for magnetization reversal of the first magnetic layer 13 may be reduced with an increase in the polarization P of the first dielectric layer 15 because the electric charge induced at the interface between the first magnetic layer 13 and the first dielectric layer 15 due to the polarization may reduce the magnetic anisotropy energy of the first magnetic layer 13. For example, when the steady current is present, the intensity of the critical magnetic field H_C for magnetization reversal may be decreased, as compared with a case in which the steady current is absent.

The similar effect can be observed when the first dielectric layer 15 is multiferroic materials. In addition to the spike current, the steady current may supply an electric field long enough to reverse the electric dipole moments of the first dielectric layer 15 so that the magnetic moments coupled to the electric dipole moments may be switched.

The magnetization direction of the first magnetic layer 13 may be determined by the direction of the magnetic field H generated around the first conductive channel 17 by the input current $I_{c(input)}$.

When the first drive voltage $V_1$ is applied through the first input portion 19, the spin current generated depending on the magnetization of the first magnetic layer 13 may be applied to the first spin-charge conversion layer 24. As spin-charge conversion occurs through the first spin-charge conversion layer 24, the first output current $I_{1(output)}$ may be induced in the second conductive channel 21. A direction of the first output current $I_{c(output)}$ may be opposite to a direction of the input current $I_{c(input)}$. The first output current $I_{1(output)}$ may be represented by a sum of the steady current and the spike current. The spike current may flow through the second conductive channel 21 in the direction away from the second dielectric layer 16. The steady current may continue to flow through the resistor 103 as the first output currents $I_{1(output)}$.

The first output current $I_{1(output)}$ may be used for magnetization switching of the second magnetic layer 14 connected in cascade. When the resistor 103 is present, though a time duration of the spike current may be about 0.1 nanosecond (ns). The steady current may continue to flow and generate an additional magnetic field H.

Accordingly, the magnetic field H generated by the steady current and the magnetic field H generated by the spike current may supply not only sufficient energy but enough time for magnetization reversal of the second magnetic layer 14. Alternatively, the magnetic field H generated by the steady current may provide a value, greater than or equal to the intensity of the critical magnetic field H_C for magnetization reversal. On the other hand, the intensity of the critical magnetic field H_C for magnetization reversal may also be reduced due to the induced charges at the interface between the second magnetic layer 14 and the second dielectric layer 16. Thus, the second magnetic layer 14 may definitely reverse or switch magnetization.

The first output voltage $V_{c(output)}$ corresponding to $I_{1c(output)}$ of the second conductive channel 21 may have a predetermined value by the first drive voltage $V_1$ through the first input portion 19. The output voltage $V_{c(input)}$ may depend on the direction of magnetization of the first magnetic layer 13.

In the above description of FIG. 7, the operating characteristics has been described under the assumption that the input current $I_{c(input)}$ flowing through the first conductive channel 17 is the sum of the spike current and the steady current.

According to a modified embodiment, even when the input current $I_{c(input)}$ flowing through the first conductive channel 17 is only spike current and the second conductive channel 21 and the resistor 103 may be connected to form a closed loop, the first output current $I_{1(output)}$ may output the steady current and the spike current.

As described above, example embodiments of the present disclosure may provide a spin logic device, capable of switching a magnetization direction of a ferromagnetic material in consideration of voltage characteristics exhibited according to the magnetization direction of the ferromagnetic material and spin-charge conversion. Although the present disclosure and its advantages have been described in detail, it should be understood that various changes, substitutions and alterations can be made herein without departing from the spirit and scope of the disclosure as defined by the following claims.

What is claimed is:

1. A spin logic device comprising:
a first stage unit in which one side of a first magnetic layer is connected to an upper end of a first spin-charge conversion layer, a first dielectric layer is connected to a lower end of the other side of the first magnetic layer, a first conductive channel for receiving input current is connected to a lower end of the first dielectric layer, a first input portion formed of a conductor for receiving a first drive voltage is connected to an upper end of one side of the first magnetic layer, a second conductive channel for outputting first output current is connected to a lower end of the first spin-charge conversion layer, and a first conductor having a ground is connected to a lower end of the second conductive channel,
wherein
a resistor for outputting steady current as the first output current is connected between nodes on opposite ends of the second conductive channel.

2. The spin logic device as set forth in claim 1, wherein when the input current is applied through the first conductive channel, spin current generated depending on magnetization of the first magnetic layer is applied to the first spin-charge conversion layer, and as spin-charge conversion occurs, the first output current is induced in the second conductive channel.

3. A spin logic device comprising:
a first stage unit in which one side of a first magnetic layer is connected to an upper end of a first spin-charge conversion layer, a first dielectric layer is connected to a lower end of the other side of the first magnetic layer, a first conductive channel for receiving input current is connected to a lower end of the first dielectric layer, a first input portion formed of a conductor for receiving a first drive voltage is connected to an upper end of one side of the first magnetic layer, a second conductive channel for outputting first output current is connected to a lower end of the first spin-charge conversion layer, and a first conductor having a ground is connected to a lower end of the second conductive channel; and
a second stage unit in which one side of a second magnetic layer is connected to an upper end of a second spin-charge conversion layer, a second dielectric layer is connected to a lower end of the other side of the second magnetic layer, the second conductive channel is connected to a lower end of the second dielectric layer, a second input portion formed of a conductor for receiving a second drive voltage is connected to an upper end of one side of the second magnetic layer, a third conductive channel for outputting second output current is connected to a lower end of the second spin-charge conversion layer, and a second conductor having a ground is connected to a lower end of the third conductive channel,
wherein
a resistor for outputting steady current as the first output current is connected between nodes on opposite ends of the second conductive channel.

4. The spin logic device as set forth in claim 3, wherein when positive current is applied as the input current while the first drive voltage is applied through the first input portion and the second drive voltage is applied through the second input portion, the magnetization of the first magnetic layer is switched from the other direction to one direction and a spin-charge conversion through the first spin-charge conversion layer occurs depending on the magnetization of the first magnetic layer to induce the first output current in the second conductive channel in a direction from the second stage unit to the first stage unit, and when the first output current is induced in the second conductive channel, the magnetization of the second magnetic layer is switched from the other direction to one direction by the first output current and a spin-charge conversion through the second spin-charge conversion layer occurs depending on the magnetization of the second magnetic layer to induce the second output current in the third conductive channel in a first direction.

5. The spin logic device as set forth in claim 3, wherein when negative current is applied as the input current while the first drive voltage is applied through the first input portion and the second drive voltage is applied through the second input portion, the magnetization of the first magnetic layer is switched from one direction to the other direction and a spin-charge conversion through the first spin-charge conversion layer occurs depending on the magnetization of the first magnetic layer to induce the first output current in the second conductive channel in a direction from the first stage unit to the second stage unit, and when the first output current is induced in the second conductive channel, the magnetization of the second magnetic layer is switched from one direction to the other direction and a spin-charge conversion through the second spin-charge conversion layer occurs depending on the magnetization of the second magnetic layer to induce the second output current in the third conductive channel in a second direction.

6. The spin logic device as set forth in claim 4, wherein in a case in which a magnetization direction of the first magnetic layer and the second magnetic layer is switched from the other direction to one direction by applying the first drive voltage through the first input portion, applying the second drive voltage through the second input portion, and applying positive current through the first conductive channel, when the first drive voltage is applied again through the first input portion and the second drive voltage is applied again through the second input portion, the second output current of the first direction is induced in the third conductive channel to be output.

7. The spin logic device as set forth in claim 5, wherein in a case in which a magnetization direction of the first magnetic layer and the second magnetic layer are switched from one direction to the other direction by applying the first drive voltage through the first input portion, applying the second drive voltage through the second input portion, and applying negative current through the first conductive channel, when the first drive voltage is applied again through the first input portion and the second drive voltage is applied again through the second input portion, the second output current of the second direction is induced in the third conductive channel to be output.

* * * * *